United States Patent
Taya

(10) Patent No.: US 9,847,771 B2
(45) Date of Patent: Dec. 19, 2017

(54) FILTER CIRCUIT IN WIRELESS RECEIVER

(71) Applicant: LAPIS Semiconductor Co., Ltd., Yokohama (JP)

(72) Inventor: Takashi Taya, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 15/227,034

(22) Filed: Aug. 3, 2016

(65) Prior Publication Data

US 2017/0040972 A1 Feb. 9, 2017

(30) Foreign Application Priority Data

Aug. 4, 2015 (JP) .................................. 2015-154179

(51) Int. Cl.
*H03H 11/12* (2006.01)
*H04B 1/12* (2006.01)
*H04B 1/18* (2006.01)

(52) U.S. Cl.
CPC ......... *H03H 11/1252* (2013.01); *H04B 1/123* (2013.01); *H04B 1/18* (2013.01)

(58) Field of Classification Search
CPC combination set(s) only.
See application file for complete search history.

(56) References Cited

U.S. PATENT DOCUMENTS

| 7,705,667 | B2 * | 4/2010 | Kousai | ............... | H03H 11/1291 |
| | | | | | 327/553 |
| 2007/0080835 | A1 * | 4/2007 | Maeda | .................. | H03D 3/009 |
| | | | | | 341/120 |
| 2007/0229152 | A1 * | 10/2007 | Kosai | ................. | H03H 11/1252 |
| | | | | | 330/100 |
| 2012/0194265 | A1 * | 8/2012 | Katsube | ............. | H03H 11/1252 |
| | | | | | 327/554 |

FOREIGN PATENT DOCUMENTS

| JP | 2008-205962 A | 9/2008 |
| JP | 2008-211531 A | 9/2008 |
| JP | 2012-054684 A | 3/2012 |

\* cited by examiner

*Primary Examiner* — Junpeng Chen
(74) *Attorney, Agent, or Firm* — Rabin & Berdo, P.C.

(57) ABSTRACT

A filter circuit for generating a filtered signal includes a first filter unit, a second filter unit, and a negative feedback resistor. The first filter unit includes a signal input unit that receives signals, a signal output unit that outputs the filtered signals, and a non-ideal integrator and a first ideal integrator that are connected in series between the signal input unit and the signal output unit. The second filter unit includes an ideal integrator that is negative feedback-connected to the non-ideal integrator or the first ideal integrator. The negative feedback resistor is connected between the signal output unit and the signal input unit of the first filter unit.

16 Claims, 16 Drawing Sheets

$\cos(2\pi f_{IF}t)$ $-\sin(2\pi f_{IF}t)$

ADDED SIGNAL

FILTER CIRCUIT IN WIRELESS RECEIVER

BACKGROUND OF THE INVENTION

Technical Field

The present invention relates to a filter circuit and to a wireless receiver.

Background Art

Wireless receivers use filter circuits that pass desired signal and attenuate noise. Complex bandpass filters are known as analog filters that are used in wireless receivers (referencing Japanese Unexamined Patent Application Publication 2008-205962, Japanese Unexamined Patent Application Publication 2008-211531, and Japanese Unexamined Patent Application Publication 2012-54684). The complex bandpass filter uses, as input signals, a Q signal and an I signal that are intermediate frequency signals with a 90° phase difference therebetween, to pass the desired signal and attenuate the noise, depending on desired paint-pass characteristics. Moreover, the complex bandpass filter operates so as to attenuate image response (image noise) through passing input signals in which a phase difference between the Q signal and the I signal is 90° and attenuating input signals in which the phase difference is −90°.

Note that in recent years, miniaturization of semiconductor elements has enabled digital processing to be achieved with smaller footprints and reduced electrical power, digital circuits have been used in addition to conventional analog circuits. However, achieving the replacement of all analog filter processing with digital filter processing would be extremely difficult from the perspective of cost, and the like. Given this, a filtering process is carried out in an analog circuit wherein the number of stages of the filter is reduced, and, thereafter, those processes which were inadequate are supplemented through digital circuits.

SUMMARY OF THE INVENTION

As described above, the image response attenuated by the complex bandpass filter. Because of this, in a filter circuit for carrying out a filtering process using both an analog circuit and a digital circuit, when a complex bandpass filter is used for the analog circuit, additional attenuation processing is performed in the digital circuit, even for the image response, after a partial attenuation process through the analog circuit. However, because the process of attenuating the image response (image interfering signals) in the analog circuit is affected greatly by temperature variations, and the like, it is difficult to identify the degree to which it has been attenuated. Consequently, in digital circuitry it is extremely difficult to carry out processing that takes into account the attenuation in the analog circuitry, and thus there is a problem in that it is not possible to perform properly the process for attenuating the image response in the wireless receiver.

Moreover, in a complex bandpass filter, the bandpass characteristics are achieved through combining together low-pass filters that are divided into two systems, corresponding to the Q signal and the I signal, respectively. Consequently, there is the need to produce a balance in the filters of the two systems, and thus there is a problem in that the filter constants, i.e., capacitance of capacitors and resistance of resistors that are included in the filters cannot be set freely.

Moreover, when the analog circuit is structured using a bandpass filter that has only a single input/output system, unlike a bandpass filter that uses two input systems, such as in a complex bandpass filter, it is necessary to connect a plurality of bandpass circuits in multiple stages in order to achieve precise filter characteristics. Because of this, when attempting to achieve the desired filter characteristics, there is a problem in that even if the filter is only a single system, still the numbers of capacitors and resistors will be large, increasing the size of the circuit.

In order to solve the problems set forth above, an object of the present invention is to provide a filter circuit that prevents an increase in the size of the circuit, and a wireless receiver that is able to attenuate an image response properly.

A filter circuit for generating a filtered signal according to an aspect of the invention includes a first filter unit including a signal input unit that receives signals, a signal output unit that outputs the filtered signals, a non-ideal integrator, and a first ideal integrator, the non-ideal integrator and the first ideal integrator being connected in series between the signal input unit and the signal output unit, a second filter unit including an ideal integrator that is negative feedback-connected to the non-ideal integrator or the first ideal integrator, and a negative feedback resistor that is connected between the signal output unit and the signal input unit of the first filter unit.

A wireless receiver for generating received data according to another aspect of the invention includes a mixer configured to generate first and second frequency signals by respectively mixing first and second local oscillator signals, which have a phase difference of 90° therebetween, with high-frequency signals that are obtained from received wireless signals having frequencies different than each other, first bandpass filter configured to extract, from the first frequency signal, a first intermediate frequency signal corresponding to a first frequency band, a second bandpass filter configured to extract, from the second frequency signal, a second intermediate frequency signal corresponding to the first frequency band. The first and second bandpass filters each includes a first filter unit having a signal input unit, a signal output unit, a non-ideal integrator and a first ideal integrator, the non-ideal integrator and the first ideal integrator being connected in series between the signal input unit and the signal output unit, a second filter unit including a second ideal integrator that is negative feedback-connected to the non-ideal integrator or the first ideal integrator, and a negative feedback resistor connected between the signal output unit and the signal input unit of the first filter unit. The wireless receiver further includes a first analog-digital converter configured to convert the first intermediate frequency signal into a digital signal to generate a first digital intermediate frequency signal, a second analog-digital converter configured to convert the second intermediate frequency signal into a digital signal to generate a second digital intermediate frequency signal, a digital processor configured to perform an attenuating process on the first and second digital intermediate frequency signals so as to attenuate image response included in the first and second digital intermediate frequency signals, and extract digital data signals corresponding to a second frequency band from the first and second digital intermediate frequency signals, and a demodulator configured to demodulate the digital data signals to generate the received data.

A wireless receiver for generating received data according to another aspect of the invention includes a filter circuit configured to extract an intermediate frequency signal corresponding to a first frequency band from a high-frequency signal obtained from a received wireless signal. The filter circuit includes a first filter unit having a signal input unit, a signal output unit, a non-ideal integrator and a first ideal integrator, the non-ideal integrator and the first ideal integrator being connected in series between the signal input unit and the signal output unit, a second filter unit including a second ideal integrator that is negative feedback-connected to the non-ideal integrator or the first ideal integrator, and a negative feedback resistor connected between the signal output unit and the signal input unit of the first filter unit. The wireless receiver further includes an analog-digital convertor configured to convert the intermediate frequency signal into a digital signal to generate a digital intermediate frequency signal, a digital processor configured to extract, from the digital intermediate frequency signal, a digital data signal corresponding to a second frequency band, and a demodulator configured to demodulate the digital data signal to generate the received data.

The present invention enables the provision of a filter circuit that prevents an increase in the circuit size, and a wireless receiver able to attenuate the image response properly.

BRIEF DESCRIPTION OF THE DRAWINGS

FIG. 6 is a circuit diagram illustrating an example of filter constants in the filter circuit 15a.

FIG. 11 is a circuit diagram illustrating another example of a structure for the filter circuit 15a.

FIG. 12 is a circuit diagram illustrating another example of a structure for the filter circuit 15a.

FIG. 13 is a circuit diagram illustrating another example of a structure for the filter circuit 15a.

FIG. 14 is a circuit diagram illustrating another example of a structure for the filter circuit 15a.

DETAILED DESCRIPTION OF THE INVENTION

Exemplary embodiments of the invention will be explained in detail below, referencing the drawings.

Exemplary Embodiment 1

Figure 1:
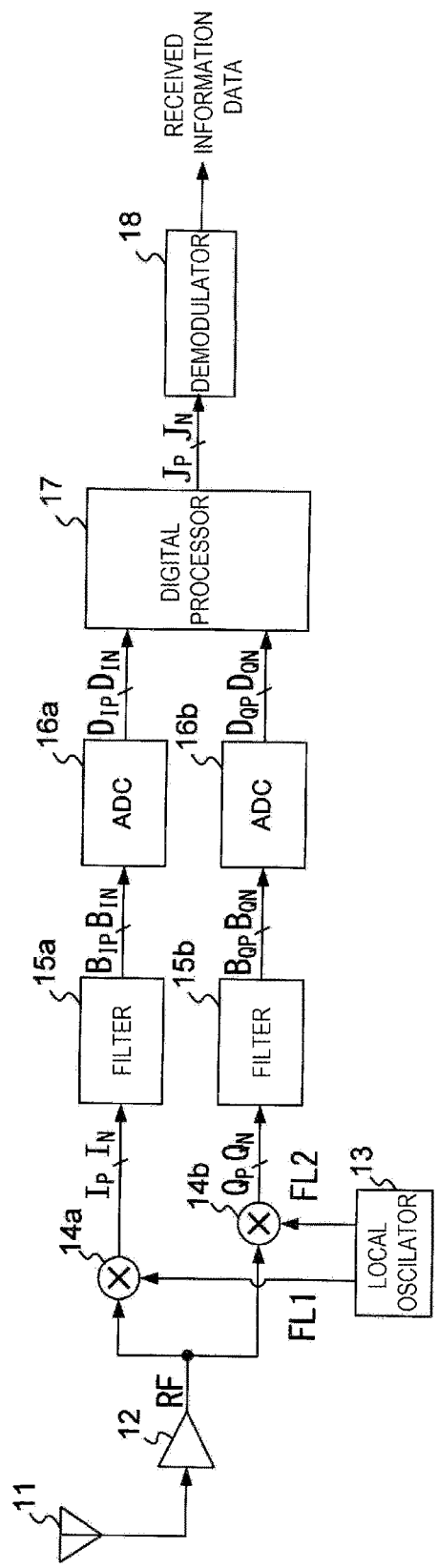
FIG. 1 is a block diagram illustrating a structure for a wireless receiver according to a first exemplary embodiment.

FIG. 1 is a block diagram illustrating a structure for a wireless receiver that includes a filter circuit according to the present invention. The wireless receiver 10 is a superheterodyne receiver, comprising an antenna 11, a low-noise amplifier 12, a local oscillator 13, mixers 14a and 14b, filter circuits 15a and 15b, and analog-digital converters (hereinafter termed "ADCs") 16a and 16b, a digital processing circuit 17, and a demodulating unit 18.

The antenna 11 receives a high-frequency signal of, for example, 2.4 GHz, transmitted from a wireless transmitter (not shown), and supplies it to the low-noise amplifier 12.

The low-noise amplifier 12 amplifies the high-frequency signal and supplies it, as an amplified received signal RF, to the mixers 14a and 14b.

The local oscillator 13 generates local oscillation signals FL1 and FL2 that have a phase difference of 90° therebetween. The local oscillator 13 supplies the local oscillation signal FL1 to the mixer 14a and the local oscillation signal FL2 to the mixer 14b.

The mixer 14a, through mixing the local oscillator signal FL1 with the amplified received signal RF, generates intermediate frequency signals $I_P$ and $I_N$ that have a frequency that is lower than that of the aforementioned high-frequency signal, for example, a frequency of several megahertz, and mutually differing polarities, and these signals are supplied to the filter circuit 15a. The mixer 14b, through mixing the local oscillator signal FL2 with the amplified received signal RF, generates an intermediate frequency signal $Q_P$ wherein the phase of the intermediate frequency signal $I_p$ has been shifted by 90°, and an intermediate frequency signal $Q_N$ wherein the phase of the intermediate frequency signal $I_N$ has been shifted by 90°, and supplies them to the filter circuit 15b. That is, the mixers 14a and 14b supply, to the filter circuits 15a and 15b, intermediate frequency signals ($I_P$ and $I_N$) and ($Q_P$ and $Q_N$) that are quadrature signals having phase differences of 90° or −90° therebetween. In the below, the intermediate frequency signals $I_P$ and $I_N$ shall be termed the "I signal," and the intermediate frequency signals $Q_P$ and $Q_N$ shall be termed the "Q signal," as general terms.

Figure 2:
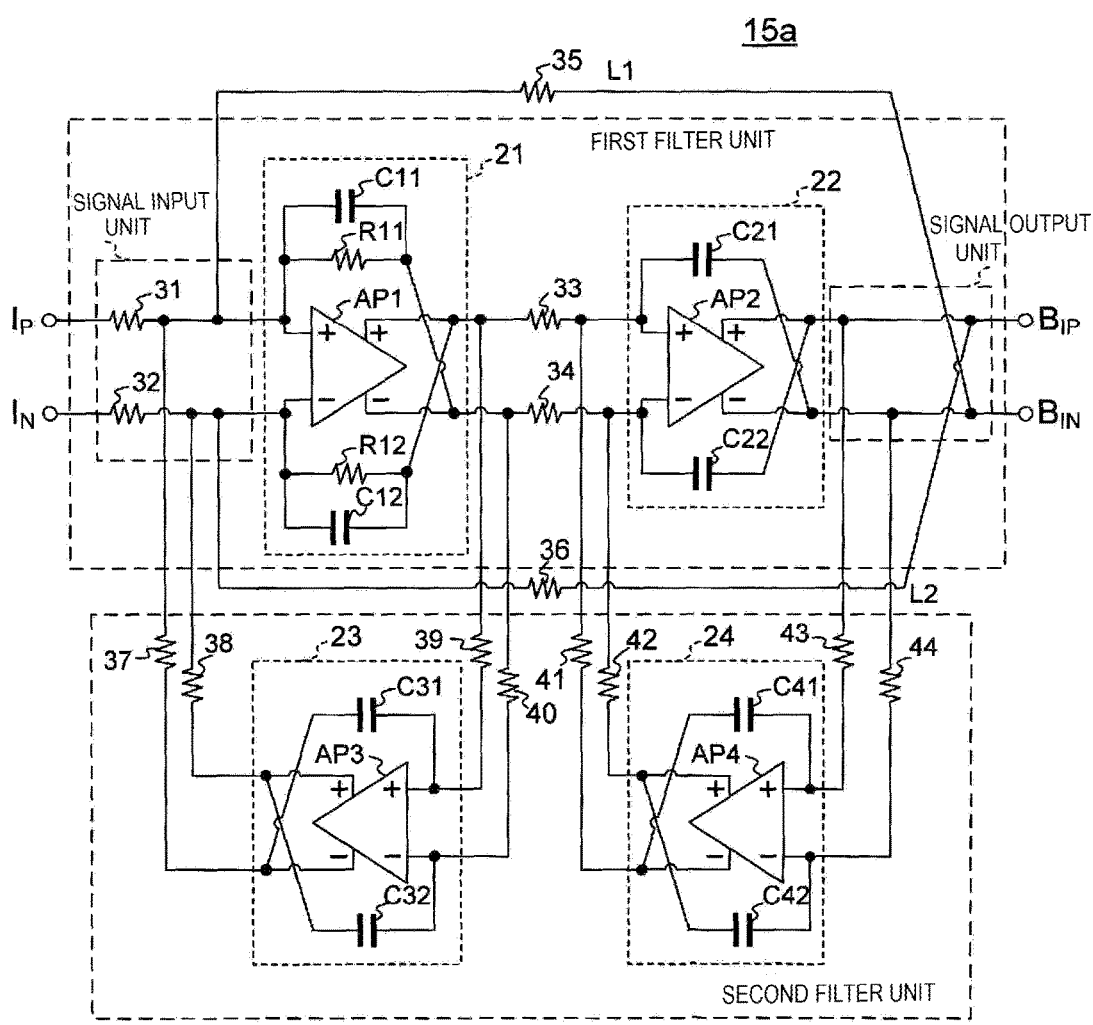
FIG. 2 is a circuit diagram illustrating a structure for a filter circuit 15a according to the first exemplary embodiment.

The filter circuits 15a and 15b are mutually independent real bandpass filters. The filter circuit 15a has the circuit structure illustrated in FIG. 2. Note that because the filter circuit 15b has the same structure as that of the filter circuit 15a, explanations regarding the structure of the filter circuit 15b will be omitted. Moreover, in the explanation below, "filter 15" will be used as a general term for referring to the filter 15a and the filter 15b.

The filter circuit 15a includes: a non-ideal integrator 21; an ideal integrator 22 as an example of a first ideal integrator; an ideal integrator 23 as an example of a second ideal integrator; an ideal integrator 24 as an example of a third ideal integrator; and resistors 31 through 44. An integrator includes a capacitor and outputs a varying voltage. The ideal integrator uses all of the current output by the capacitor, whereas the non-ideal integrator also includes a resistor connected to the capacitor in parallel so that a part of current is consumed in the resistor. In general, an ideal integrator is also called as a complete integrator, and a non-ideal integrator is also called as an incomplete integrator or a leaky integrator. The non-ideal integrator 21 and the ideal integrator 22 are connected in series, to structure a biquad-type first filter unit. The ideal integrators 23 and 24 structure a second filter unit.

The non-ideal integrator 21 is structured from an operational amplifier AP1, resistors R11 and R12, and capacitors C11 and C12. The operational amplifier AP1 is a differential output operational amplifier. The inverting input terminal and the non-inverting input terminal of the operational amplifier AP1, together with the resistors 31 and 32, structure a signal input unit of the filter circuit 15*a*.

One end each of the resistor R11 and the capacitor C11 are connected to the non-inverting input terminal of the operational amplifier AP1. One end each of the resistor R12 and the capacitor C12 are connected to the inverting input terminal of the operational amplifier AP1. The other ends of the resistor R12 and the capacitor C12 are connected to the non-inverting output terminal of the operational amplifier API. The other ends of the resistor R11 and the capacitor C11 are connected to the inverting output terminal of the operational amplifier AP1. The resistor R11 and the capacitor C11 are connected in parallel. The resistor R12 and the capacitor C12 are connected in parallel.

The ideal integrator 22 is structured from an operational amplifier AP2 and the capacitors C21 and C22. The operational amplifier AP2 is a differential output operational amplifier. The inverting output terminal and non-inverting output terminal of the ideal integrator 22 form a signal output unit of the filter circuit 15*a*.

One end of the capacitor C21 is connected to the non-inverting input terminal of the operational amplifier AP2. One end of the capacitor C22 is connected to the inverting input terminal of the operational amplifier AP2. The other end of the capacitor C22 is connected to the non-inverting output terminal of the operational amplifier AP2. The other end of the capacitor C21 is connected to the inverting output terminal of the operational amplifier AP2.

The ideal integrator 23 is formed of an operational amplifier AP3 and the capacitors C31 and C32. One end of the capacitor C31 is connected to the non-inverting input terminal of the operational amplifier AP3. One end of the capacitor C32 is connected to the inverting input terminal of the operational amplifier AP3. The other end of the capacitor C32 is connected to the non-inverting output terminal of the operational amplifier AP3. The other end of the capacitor C31 is connected to the inverting output terminal of the operational amplifier AP3.

The ideal integrator 24 is formed of an operational amplifier AP4 and the capacitors C41 and C42. One end of the capacitor C41 is connected to the non-inverting input terminal of the operational amplifier AP4. One end of the capacitor C42 is connected to the inverting input terminal of the operational amplifier AP4. The other end of the capacitor C42 is connected to the non-inverting output terminal of the operational amplifier AP4. The other end of the capacitor C41 is connected to the inverting output terminal of the operational amplifier AP4.

The non-ideal integrator 21 and the ideal integrator 22 are connected in series, to form a biquad circuit. That is, the non-inverting output terminal of the operational amplifier AP1 of the non-ideal integrator 21 is connected to the non-inverting input terminal of the operational amplifier AP2 of the ideal integrator 22 through a resistor 33.

The inverting output terminal of the operational amplifier AP1 of the non-ideal integrator 21 is connected to the inverting input terminal of the operational amplifier AP2 of the ideal integrator 22 through a resistor 34.

Moreover, the inverting output terminal of the operational amplifier AP2 of the ideal integrator 22 is connected to the non-inverting input terminal of the operational amplifier AP1 of the non-ideal integrating circuit 21 through a line L1 that includes a resistor 35. On the other hand, the non-inverting output terminal of the operational amplifier AP2 is connected to the inverting input terminal of the operational amplifier AP1 through a line L2 that includes a resistor 36. That is, the resistors 35 and 36 are negative feedback resistors that are connected in parallel between the signal output unit and the signal input unit of the first filter unit. The output signal from the signal output unit is supplied to the signal input unit through the line L1 that includes the resistor 35 that is a first negative feedback resistor, and through the line L2 that includes a second negative feedback resistor 36, after the polarity is inverted.

Moreover, the ideal integrator 23 is feedback-connected (negative feedback-connected) to the non-ideal integrator 21. That is, the non-inverting output terminal of the operational amplifier AP1 of the non-ideal integrator 21 is connected to the non-inverting input terminal of the operational amplifier AP3 of the ideal integrator 23 through the resistor 29. The inverting output terminal of the operational amplifier AP1 of the non-ideal integrator 21 is connected to the inverting input terminal of the operational amplifier AP3 of the ideal integrator 23 through a resistor 40. On the other hand, the non-inverting output terminal of the operational amplifier AP3 of the ideal integrator 23 is connected to the inverting input terminal of the operational amplifier AP1 of the non-ideal integrator 21 through a resistor 38. The inverting output terminal of the operational amplifier AP3 of the perfect integrated circuit 23 is connected to the non-inverting input terminal of the operational amplifier AP1 of the non-ideal integrator 21 through a resistor 37. That is, the ideal integrator 23 amplifies the output of the non-ideal integrator 21 and inverts the polarity thereof, and supplies it to the input unit of the non-ideal integrator 21.

Moreover, the ideal integrator 24 is feedback-connected (negative feedback-connected) to the ideal integrator 22. That is, the non-inverting output terminal of the operational amplifier AP2 of the ideal integrator 22 is connected to the non-inverting input terminal of the operational amplifier AP4 of the ideal integrator 24 through the resistor 43. The inverting output terminal of the operational amplifier AP2 of the ideal integrator 22 is connected to the inverting input terminal of the operational amplifier AP4 of the ideal integrator 24 through the resistor 44. On the other hand, the non-inverting output terminal of the operational amplifier AP4 of the ideal integrator 24 is connected to the inverting input terminal of the operational amplifier AP2 of the ideal integrator 22 through a resistor 42. The inverting output terminal of the operational amplifier AP4 of the ideal integrator 24 is connected to the non-inverting input terminal of the operational amplifier AP2 of the ideal integrator 22 through the resistor 41. That is, the ideal integrator 24 amplifies the output of the ideal integrator 22 and inverts the polarity thereof, and supplies it to the input unit of the ideal integrator 22.

Of the intermediate frequency signals $I_P$ and $I_N$ that are supplied from the mixer 14*a*, $I_P$ is supplied to the non-inverting input terminal of the operational amplifier AP1 of the non-ideal integrator 21 through a resistor 31, and the intermediate frequency signal $I_N$ is supplied to the inverting input terminal of the operational amplifier AP1 of the non-ideal integrator 21 through a resistor 32. The filter circuit 15*a* passes a signal of a prescribed frequency band, from among the signal components that are superimposed in the intermediate frequency signal $I_{IP}$, as an intermediate frequency signal $B_{IP}$, in accordance with the filter characteristics (that is, the frequency pass/attenuation characteristics) that are determined by the filter constants such as the resistance and capacitance of respective components, and sends it to the non-inverting output terminal of the operational amplifier AP2 of the ideal integrator 22. Moreover, the filter circuit 15*a* passes a signal of a prescribed frequency band, from among the signal components that are superimposed in the intermediate frequency signal $I_N$, as an intermediate frequency signal $B_{IN}$, in accordance with the filter characteristics that are determined by the filter constants such as the resistance and capacitance of the various components, and sends it to the inverting output terminal of the operational amplifier AP2 of the ideal integrator 22.

Similarly, the filter circuit 15b passes the signals in the prescribed frequency band, from among the intermediate frequency signals $Q_P$ and $Q_N$ that are supplied from the mixer 14b, in accordance with the filter characteristics that are determined by the filter constants such as the resistance and capacitance of the respective components, and sends the as the intermediate frequency signals $B_{QP}$ and $B_{QN}$.

Figure 3A:
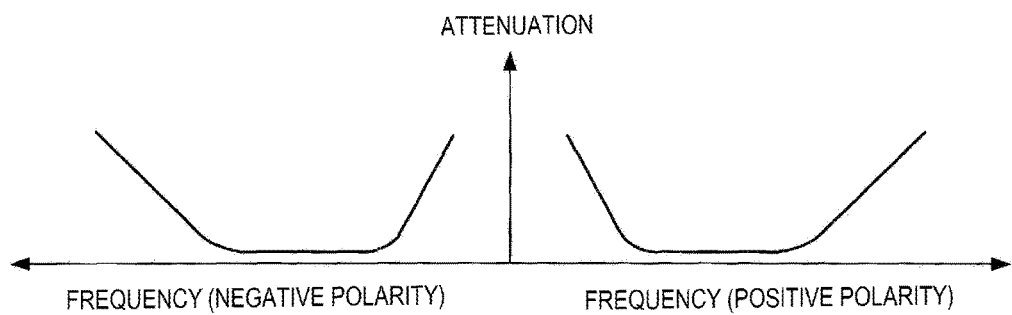
FIG. 3A is a diagram illustrating an example of the filter characteristics of filter circuits 15a and 15b.

FIG. 3A is a diagram illustrating schematically the filter characteristics of the filter circuits 15a and 15b. If the two intermediate frequency signals (the I signal and the Q signal) have, for example, a cosign-sign relationship, then this is expressed as a "positive polarity," and if they have a cosign-negative sign relationship, then this is expressed as a "negative polarity." In the exemplary embodiment, the filter circuits 15a and 15b are real bandpass filters corresponding, respectively, to the I signal and the Q signal, and thus, as shown in FIG. 3A, the filter characteristics will be symmetrical for the case of the frequency having a positive polarity and the case of the frequency having a negative polarity.

Referring again to FIG. 1, an ADC 16a converts the intermediate frequency signals $B_{IP}$ and $B_{IN}$ into digital signals, to produce the digital intermediate frequency signals $D_{IP}$ and $D_{IN}$, which are supplied to the digital processing circuit 17. The ADC 16b converts the intermediate frequency signals $B_{QP}$ and $B_{QN}$ to digital signals, to produce the digital intermediate frequency signals $D_{QP}$ and $D_{QN}$, which are supplied to the digital processing circuit 17.

The digital processing circuit 17, based on the digital intermediate frequency signals $D_{IP}$ and $D_{IN}$ and the digital intermediate frequency signals $D_{QP}$ and $D_{QN}$, passes the signals that correspond to a prescribed frequency band, to produce digital data signals $J_P$ and $J_N$. Specifically, a process is performed so that if the phase relationship is a cosign-sign relationship then the signal is passed, but if a cosign-negative sign relationship, then the signal is attenuated.

Figure 4A:
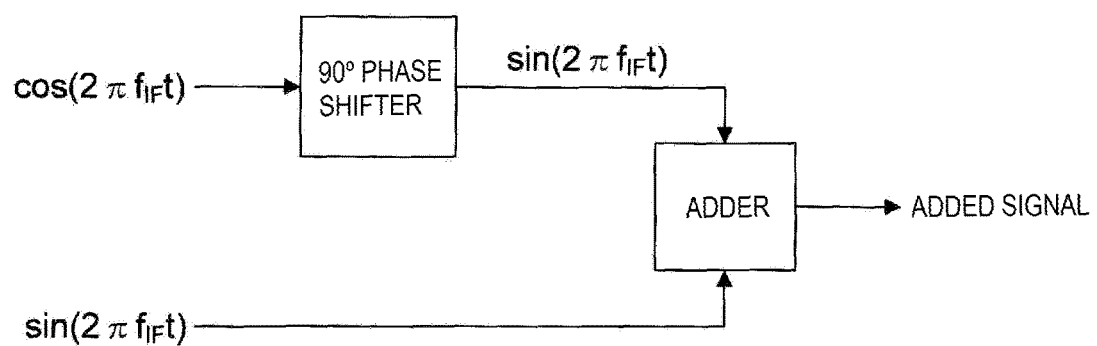
FIGS. 4A-4C are conceptual diagrams illustrating an example of processing in the digital processing circuit.
Figure 4B:
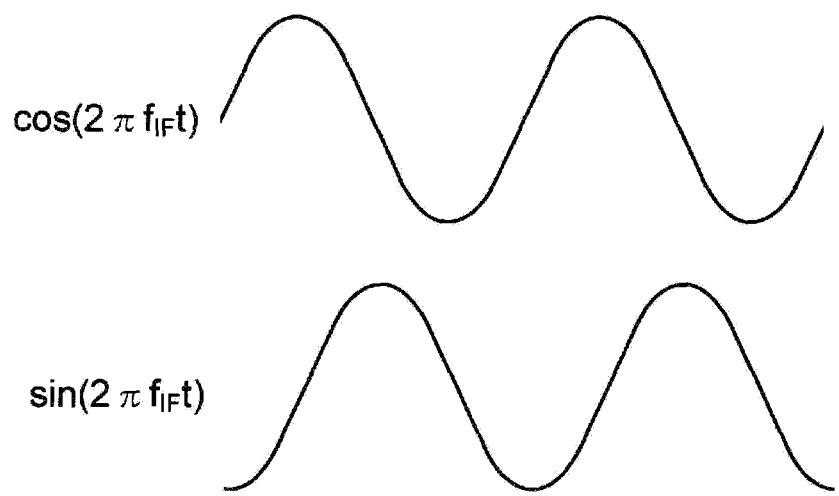
Figure 4C:
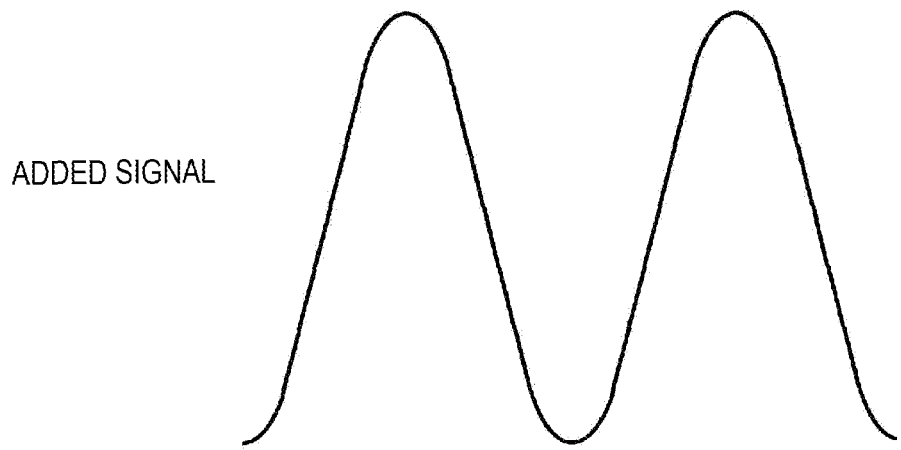

FIGS. 4A-4C and FIGS. 5A-5C are conceptual diagrams illustrating schematically the processing in the digital processing circuit 17. For example, as illustrated in FIG. 4B, when the $\cos(2\pi f_{IF}t)$ and the $\sin(2\pi f_{IF}t)$ for signals having a 90° phase difference are taken, then, as illustrated in FIG. 4A, the digital processing circuit 17 shifts the phase of $\cos(2\pi f_{IF}t)$ by 90° (phase shifting), and takes $\sin(2\pi f_{IF}t)$, and adds them together. Through this, the added signal that is illustrated in FIG. 4C is produced. Ideally, this should produce an added signal of $2 \sin(2\pi f_{IF}t)$, that has twice the amplitude of $\sin(2\pi f_{IF}t)$.

Figure 5A:
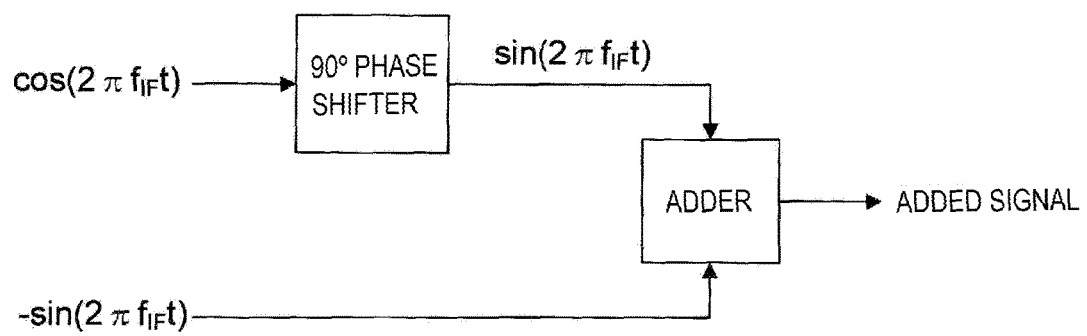
FIGS. 5A-5C are conceptual diagrams illustrating an example of processing in the digital processing circuit.
Figure 5B:
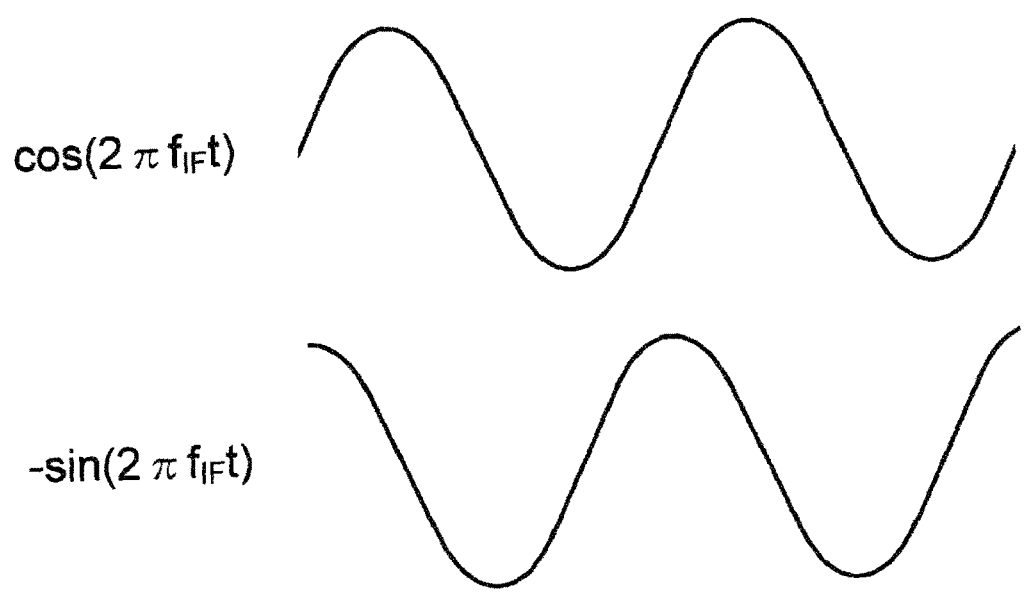
Figure 5C:

On the other hand, when $\cos(2\pi f_{IF}t)$ and negative sin $(2\pi f_{IF}t)$ for signals having a −90° phase difference are taken, as illustrated in FIG. 5B, then, as illustrated in FIG. 5A, the digital processing circuit 17 shifts the phase of $\cos(2\pi f_{IF}t)$ by 90° (phase shifting), and takes $\sin(2\pi f_{IF}t)$, and adds them together. This generates the added signal as illustrated in FIG. 5C. Ideally, the added signal should be a signal having an amplitude of zero.

Figure 3B:
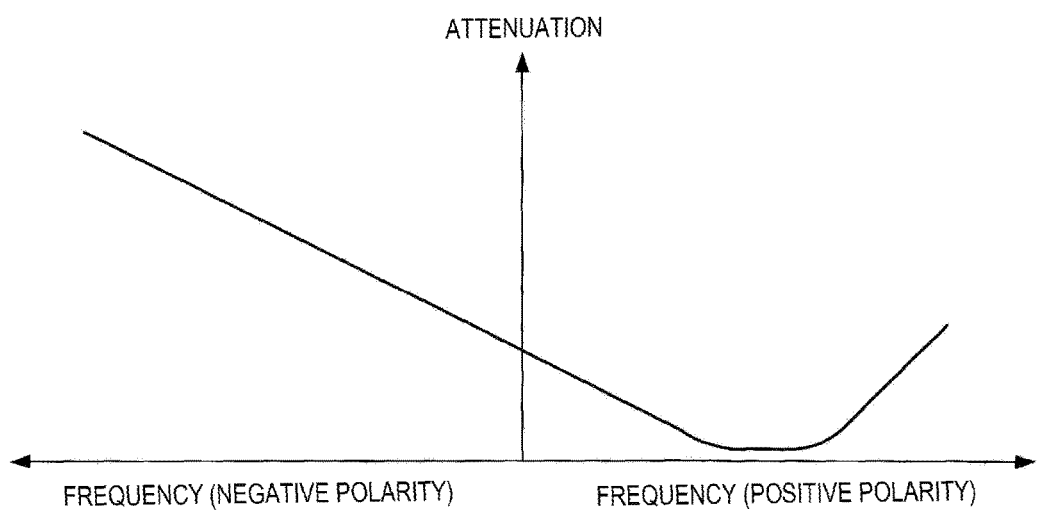
FIG. 3B is a diagram illustrating an example of the filter characteristics of a digital processing circuit.

FIG. 3B is a diagram illustrating frequency characteristics in the processing described above for the digital processing circuit 17. Through the processing illustrated in FIGS. 4A-4C and FIGS. 5A-5C, the digital processing circuit 17 will pass the signals wherein the phase relationships of the digital intermediate frequency signals $D_{IP}$ and $D_{IN}$, and of $D_{QP}$ and $D_{QN}$, are cosign-sign relationships, and will attenuate those signals if the relationships are cosign-negative sign relationships. That is, if the digital intermediate frequency signals that are inputted into the digital processing circuit 17 are of positive polarity, then the signals of the prescribed frequency band will be passed, but if of a negative polarity, they will be attenuated. Because of this, the image response that appears in the negative polarity will be attenuated.

As illustrated in FIG. 1, the demodulating unit 18 carries out a demodulating process on the digital data signals JP and JN, which have passed through the digital processing circuit 17, to restore the received information data.

In this way, the filter circuits 15a and 15b according to the present exemplary embodiment are mutually independent real filters that correspond to the I signal and the Q signal, unlike complex bandpass filters. Consequently, as illustrated in FIG. 3A, the filter characteristics will be symmetrical for the case wherein the frequency has a positive polarity and the case wherein the frequency has a negative polarity, and thus no procedure for attenuating the image response will be carried out in the filter circuits 15a and 15b. Because of this, as illustrated in FIG. 3B, the attenuation process for the image response is carried out completely within the digital processing circuit 17. As an effect, the wireless receiver 10 according to the present embodiment is able to carry out a process for attenuating the image response in the digital processing circuit, without needing to consider an attenuating process for the image response in an analog filter, which would tend to be effected by temperature variations, variations in power supply voltages, changes over time, and the like.

Figure 6:
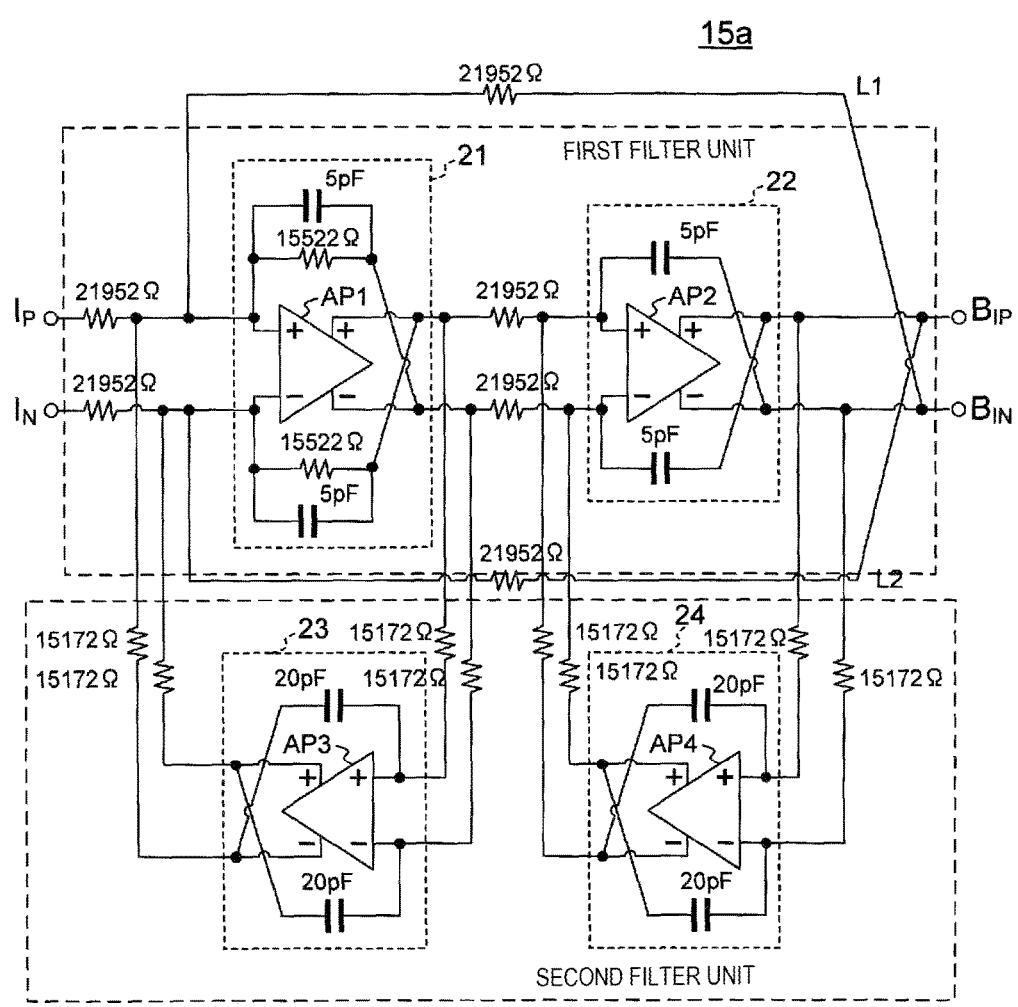

Moreover, because the filter circuits 15a and 15b according to the present exemplary embodiment are mutually independent real filters, the filter constants such as the resistance of the resistors included in the filter and the capacitance of the capacitors included in the filter can be set freely, making it possible to achieve desired filter characteristics in a desirable circuit scope. For example, as illustrated in FIG. 6, setting the capacitance of the capacitors for the non-ideal integrator 21 and the ideal integrator 22 to be small (for example, 5 pF) at, for example, no more than ½ that of the capacitance for the capacitors in the ideal integrators 23 and 24 (which are, for example, 20 pF), makes it possible to keep the areas of the filter circuits 15a and 15b small. Moreover, in the FIG. 6, conversely, setting the capacitance as of the capacitors in the ideal integrators 23 and 24 so as to be small, at no more than ½ the capacitance in the non-ideal integrator 21 and the ideal integrator 22 makes it possible to keep the areas of the filter circuits 15a and 15b small.

Figure 7:
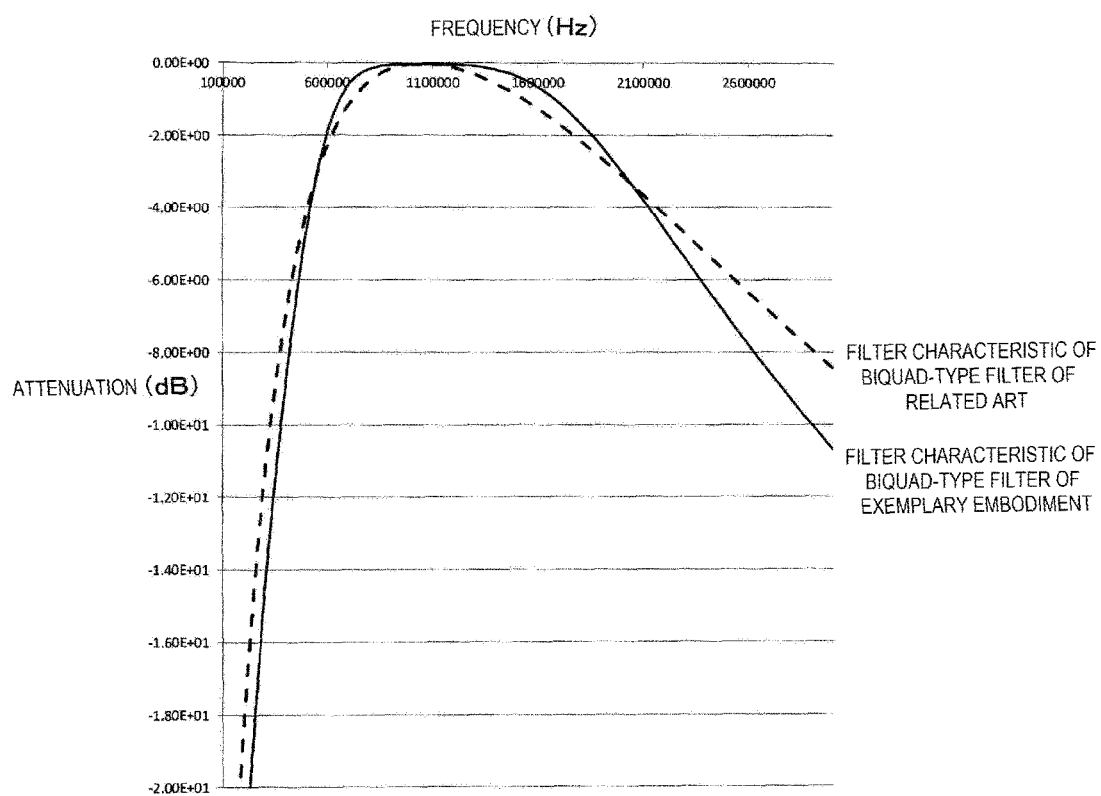
FIG. 7 is a diagram illustrating an example of filter characteristics of the filter circuits 15a and 15b.

Moreover, as illustrated in FIG. 7, when the frequency characteristics of the filter circuits 15a and 15b according to the present exemplary embodiment are compared to the frequency characteristics of conventional real bandpass filters with time constants that are essentially the same, with the same number of capacitor elements and resistive elements, the frequency characteristics of the filter circuits 15a and 15b according to the present exemplary embodiment (indicated by the solid line) have Butterworth characteristics wherein attenuation characteristics of the passband are flatter and the cutoff characteristics of the stopband are sharper, than the frequency characteristics of a conventional real bandpass filter (indicated by the dotted line).

Moreover, as illustrated in FIG. 3A and FIG. 3B, setting the lower-limit frequency for the passband on the positive polarity side for the frequency characteristics in the filter circuits 15a and 15b so as to be lower than the lower-limit frequency of the passband for the frequency characteristics of the digital processing circuit 17 makes it possible to set the attenuation of an anti-aliasing filter, i.e., a cutoff characteristic of the loopback noise, to be greater than in the case of providing anti-aliasing filters between the filter circuits 15a and 15b and the ADCs 16a and 16b in, for example, FIG. 1.

Exemplary Embodiment 2

Figure 8:
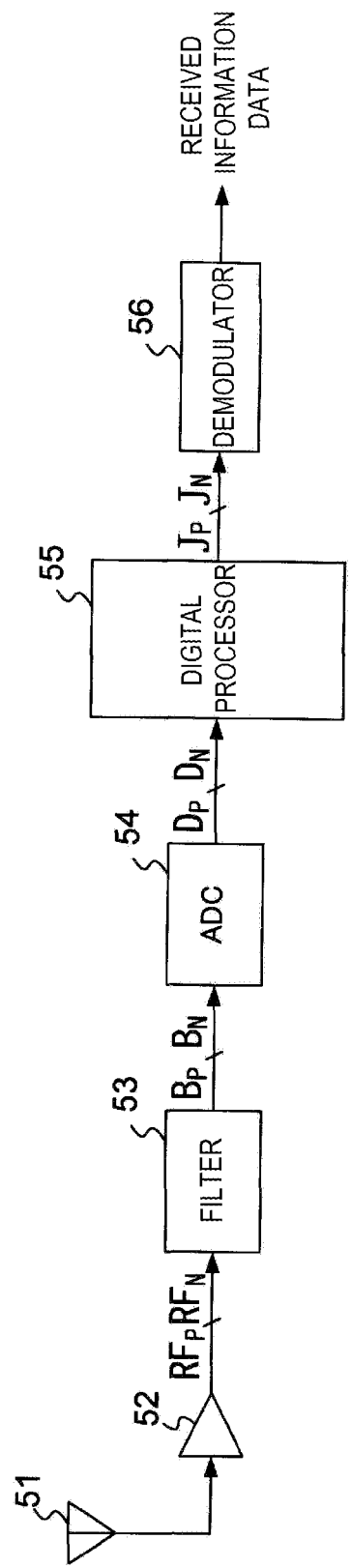
FIG. 8 is a block diagram illustrating a structure for a wireless receiver 50 according to a second exemplary embodiment.

FIG. 8 is a block diagram illustrating a structure for a wireless receiver that includes a filter circuit according to a second exemplary embodiment. The wireless receiver 50 is a straight receiver, unlike the wireless receiver 10 of the first exemplary embodiment, and includes an antenna 51, a low-noise amplifier 52, a filter circuit 53, an ADC 54, a digital processing circuit 55, and a demodulating unit 56.

The antenna 51 receives a high-frequency signal that is transmitted from a wireless transmitter, and supplies it to the low-noise amplifier 52.

The low-noise amplifier 52 amplifies the high-frequency signal to generate amplified receive signals $RF_P$ and $RF_N$ of mutually differing polarities, and supplies them to the filter circuit 53.

Figure 9:
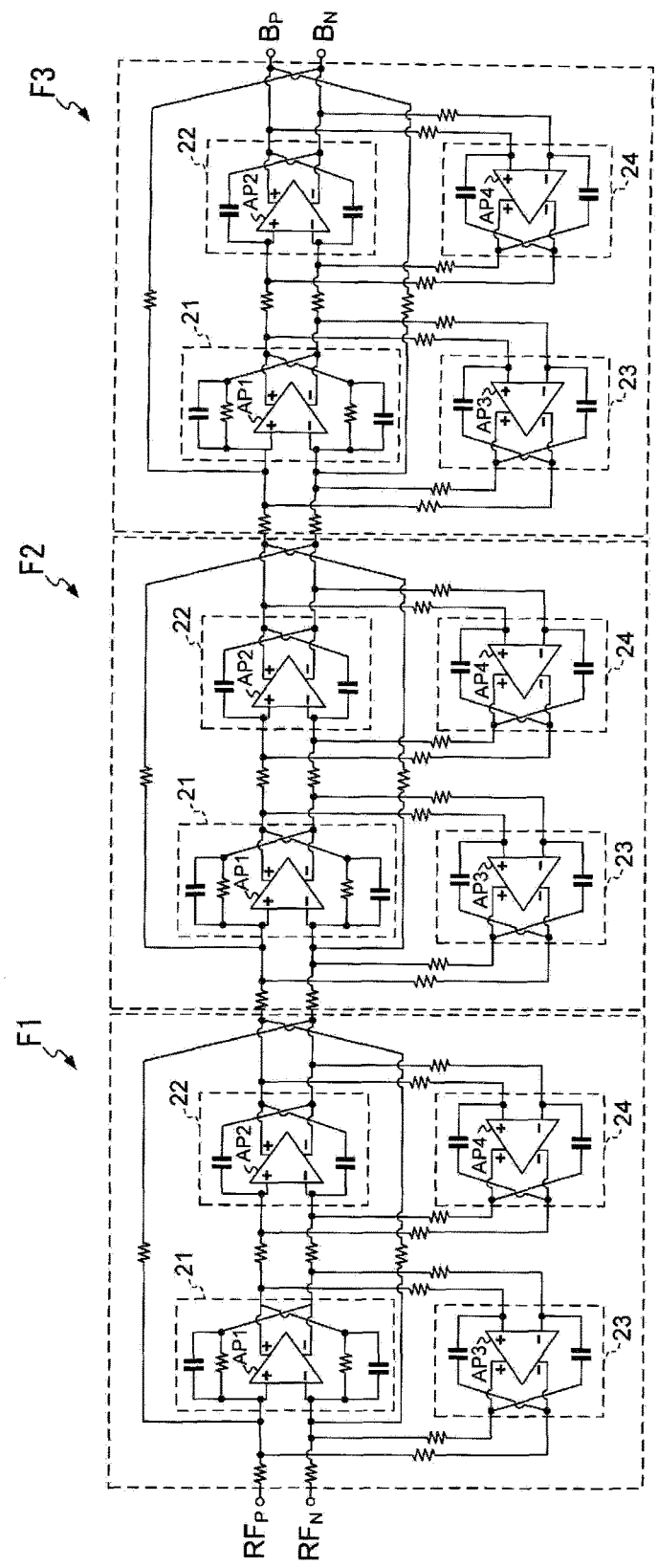
FIG. 9 is a circuit diagram illustrating a structure for a filter circuit 53 according to the second exemplary embodiment.

The filter circuit 53 is formed of filters F1, F2, and F3, which are cascade-connected, as illustrated in FIG. 9. The filters F1, F2, and F3 have structures that are each similar to the filter circuits 15 (15a and 15b) in the first exemplary embodiment. That is, the filter circuit 53 has a structure wherein filter circuits that are identical to the filter circuit 15a in the first exemplary embodiment are cascade-connected in three stages.

The amplified received signal $RF_P$ is supplied to the non-inverting input terminal of the operational amplifier AP1 in filter F1. The amplified received signal $RF_N$ is supplied to the inverting input terminal of the operational amplifier AP1 in the filter F1. The filter circuit 53 passes signals within a prescribed frequency band among those signal components that are superimposed in the amplified received signal $RF_P$, to produce an intermediate frequency signal $B_P$, and outputs them from the non-inverting output terminal of the operational amplifier AP2 of the filter F3. Moreover, the filter circuit 53 passes signals within the prescribed frequency band among the signal components that are superimposed in the amplified receive circuit $RF_N$, to produce the intermediate frequency signal $B_N$, and outputs them from the inverting output terminal of the operational amplifier AP2 of the filter F3.

Figure 10:
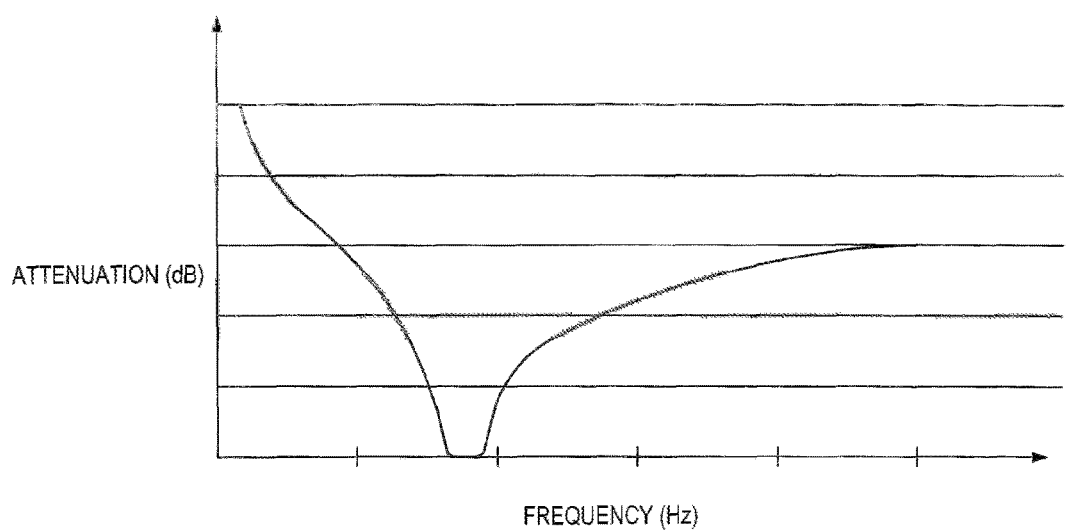
FIG. 10 is a diagram illustrating an example of filter characteristics of the filter circuit 53.

In this way, the filter circuit 53 has a structure wherein a plurality of filter circuits are cascade-connected. This makes it possible to achieve a filter circuit that has even sharper filter characteristics than those of the filter circuits 15a and 15b illustrated in FIG. 1, as shown in, for example, FIG. 10.

The filter circuit 53 of the structure set forth above enables the production of an analog filter having sharp filter characteristics, through a simple structure, in a straight receiver wherein it is not necessary to eliminate the image response.

As explained above, the filter circuits (15a, 15b, and 53) in the present invention are real bandpass filters, not complex bandpass filters, thus enabling the filter constants if the filters to be set freely in accordance with the desired filter characteristics. Consequently, it is possible to prevent the increase in the circuit scale of the analog filter circuits.

Moreover, because the filter circuits according to the exemplary embodiments are independent real bandpass filters, they do not eliminate the image response. As a result, not only can a straight receiver, wherein there is no need to eliminate the image response, be used, but also, when used as an analog filter for a receiver that is compatible with signals of the I and Q double-signal system, such as in a superheterodyne technique, the process for attenuating the image response can be carried out properly in the digital processing circuit 17, without considering the attenuation of the image response in the analog filter.

Figure 11:
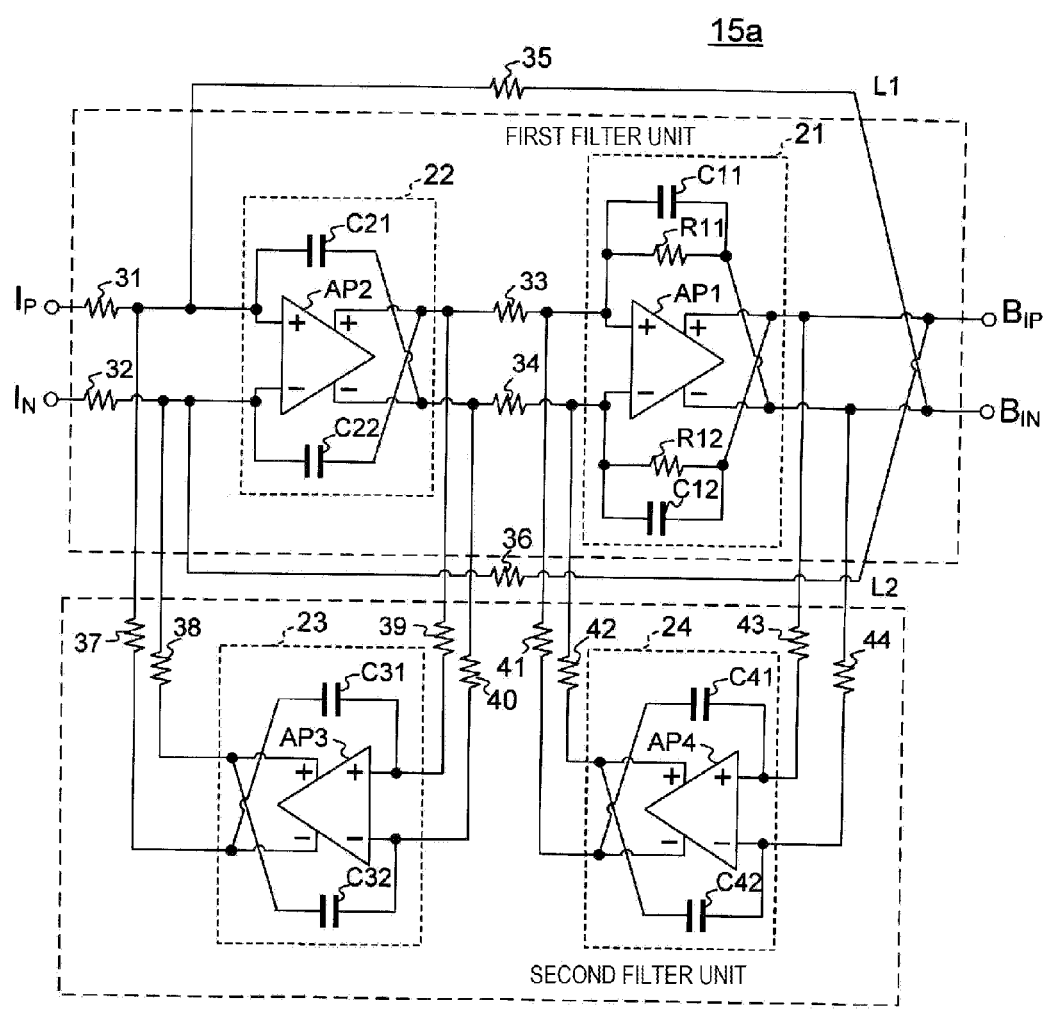

Note that the present invention is not limited to the embodiments set forth above. For example, in the filter circuits 15 (15a and 15b) in the first exemplary embodiment and the filters F1 through F3 in the second exemplary embodiment, the first filter unit needs only be formed of the non-ideal integrator 21 and the ideal integrator 22 that are connected in series, where either may be positioned as the first stage (the side into which the signal is inputted). For example, unlike the structure illustrated in FIG. 2, the ideal integrator 22 may be positioned as the stage prior to the non-ideal integrator 21, as illustrated in FIG. 11.

Figure 12:
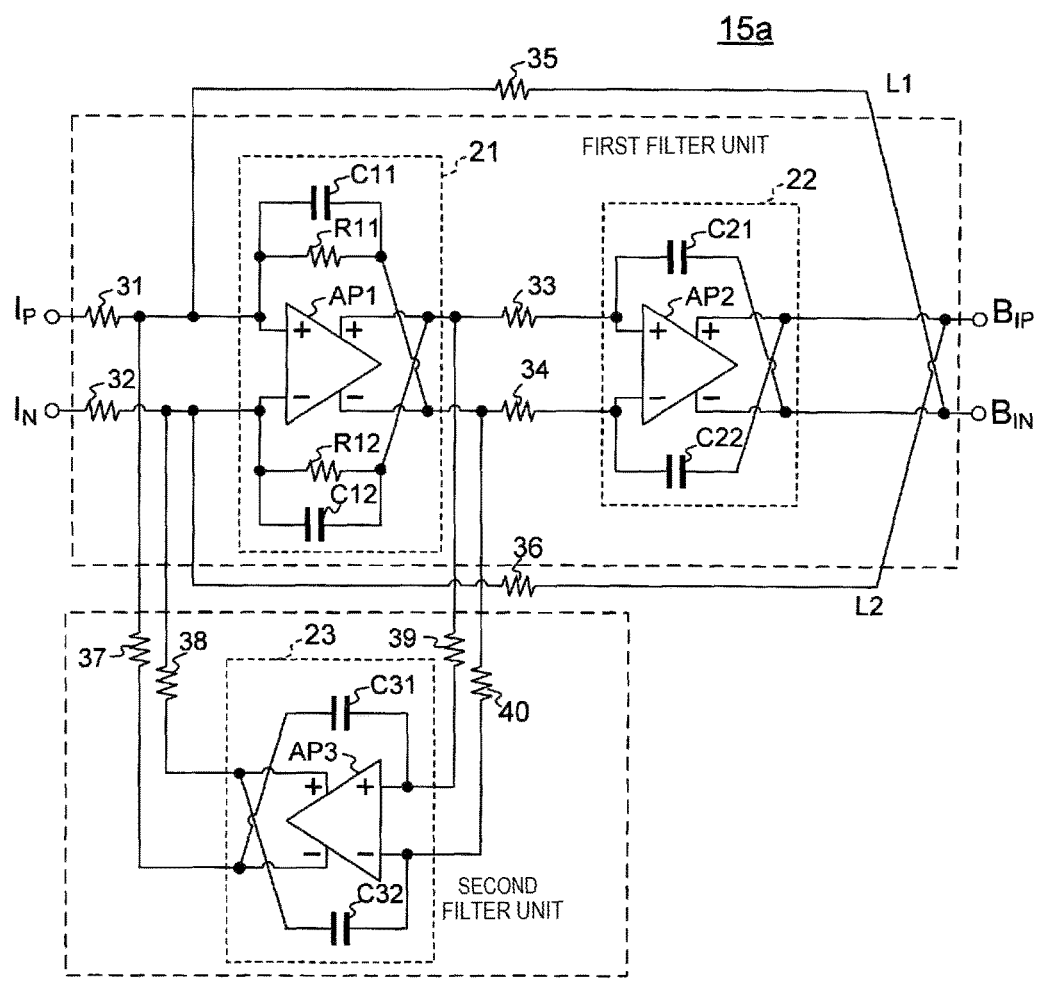
Figure 13:
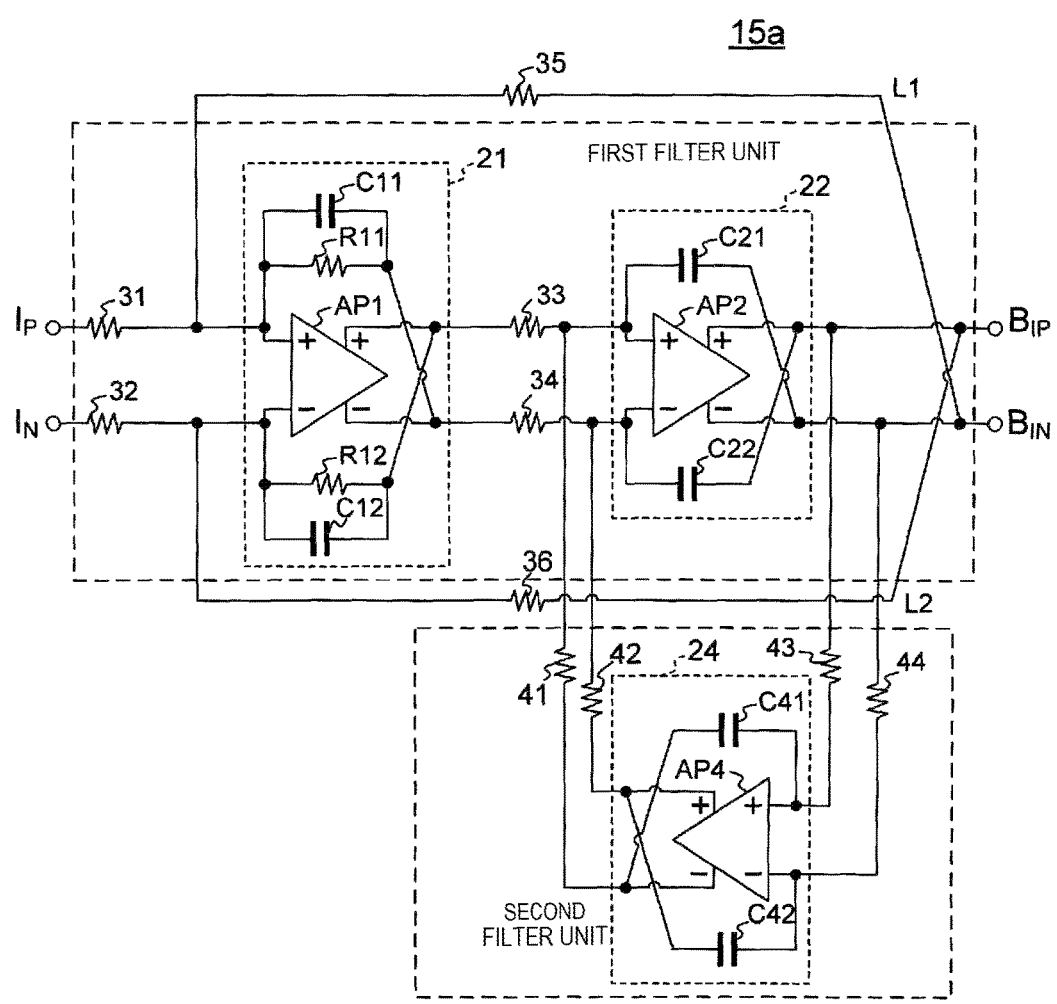

Moreover, in the filter circuits 15 (15a and 15b) in the first exemplary embodiment and the filters F1 through F3 in the second exemplary embodiment, the second filter unit should be formed of at least one ideal integrator. For example, as illustrated in FIG. 12 and FIG. 13, the structure may be with either the ideal integrator 23 or the ideal integrator 24 alone.

Figure 14:
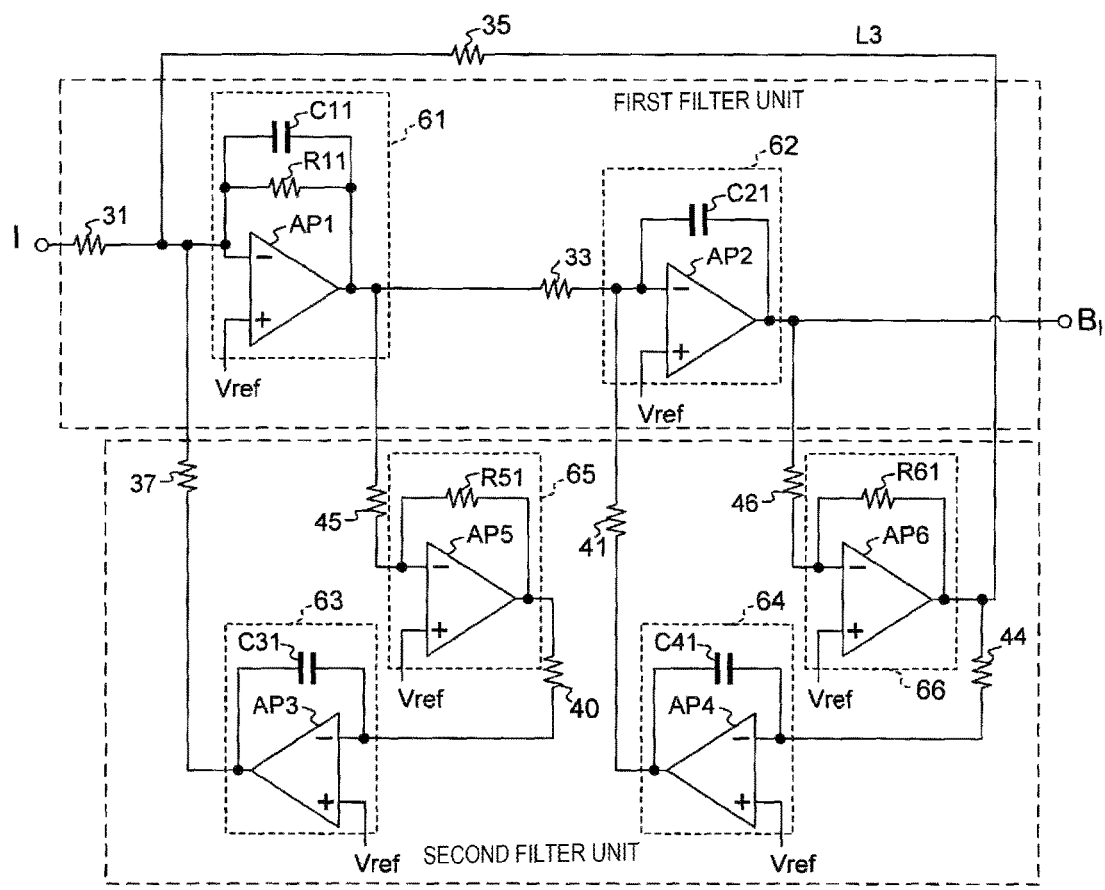

Moreover, in the embodiments set forth above, the explanations were for examples wherein the circuit filters 15 (15a and 15b) and the filters F1 through F3 were formed of differential output operational amplifiers AP1 through AP4, there is no limitation thereto, but rather the structure may be from single-end operational amplifiers. In this case, as illustrated in FIG. 14, for example, the filter circuit 15a is formed of: a first filter unit, made from a non-ideal integrator 61 and an ideal integrator 62; a second filter unit made from an ideal integrator 63, an ideal integrator 64, an inverting circuit 65, and an inverting circuit 66; and a line L3 that includes a resistor 35 that is a negative feedback resistor. Each of the non-inverting input terminals in the operational amplifiers AP1 through AP6 are connected to respective reference voltages of $V_{ref}$.

Moreover, the numbers of capacitors and filters for structuring the filter circuit, and the values thereof, can be varied through switching switches, or the like, to provide a circuit wherein the filter characteristics can be changed.

Moreover, instead of operational amplifiers AP1 through AP4, the ideal integrators and non-ideal integrating circuits may be formed using combinations of inverter-type inverting amplifiers.

Moreover, in the first exemplary embodiment, the explanation was for an example wherein the image response was eliminated through a digital processing circuit in a superheterodyne receiver. However, instead of processing using a digital processing circuit, instead another filter may be provided for eliminating the image response prior to the analog filter, for example, to eliminate the image response. In this case as well, the attenuation process for the image response is not carried out by the filter circuits 15 in the present invention, making it possible to eliminate the image response properly through the other filter, rather than having to be concerned about the effects of the attenuation process in the filter circuits 15.

Moreover, in the first exemplary embodiment an example was explained wherein a so-called "single superheterodyne receiver," wherein the frequency conversion through the mixer was of only a single stage, was used, and in the second exemplary embodiment, the explanation was for an example wherein a straight receiver, without frequency conversion, was used. However, there is no limitation thereto, but rather a receiver may be used that performs frequency conversion into two or more stages, such as with the double superheterodyne method or the sliding IF method.

Basically, the filter circuits according to the invention have the distinctive features of comprising: a first filter unit, formed of a non-ideal integrator (21) and a first ideal integrator (22), connected in series, having a single input unit and a single output unit; a second filter unit that includes a non-ideal integrator or at least one ideal integrator (23 and 24) with a negative feedback connection to a first integrating circuit; and negative feedback resistors (35 and 36) that are connected between the signal output unit and the signal input unit for the first filter unit.

What is claimed is:

1. A filter circuit for generating a filtered signal, comprising:
   a first filter unit including
      a signal input unit that receives signals,
      a signal output unit that outputs the filtered signals,
      a non-ideal integrator and a first ideal integrator that are connected in series between the signal input unit and the signal output unit;
   a second filter unit including an ideal integrator that is negative feedback-connected to the non-ideal integrator or the first ideal integrator; and
   a negative feedback resistor that is connected between the signal output unit and the signal input unit of the first filter unit.

2. The filter circuit as set forth in claim 1, wherein:
   the non-ideal integrator includes an operational amplifier;
   the first ideal integrator includes a first operational amplifier;
   the ideal integrator of the second filter unit is a second ideal integrator that is negative feedback-connected between an output terminal and an input terminal of the operational amplifier of the non-ideal integrator, and
   the second filter unit further includes a third ideal integrator that is negative feedback-connected between an output terminal and an input terminal of the first operational amplifier of the first ideal integrator.

3. The filter circuit as set forth in claim 2, wherein:
   the non-ideal integrator includes a resistor and a capacitor that are connected in parallel between the output terminal and the input terminal of the operational amplifier of the non-ideal integrator;
   the second and third ideal integrators include a second operational amplifier and a third operational amplifier, respectively;
   the first, second, and third ideal integrators include, respectively a first, a second, and a third capacitor, connected between an output terminal and an input terminal of the first, the second, and the third operational amplifier, respectively;
   the output terminal of the operational amplifier of the non-ideal integrator is connected to the input terminal of the first operational amplifier of the first ideal integrator; and
   the output terminal of the first operational amplifier of the first ideal integrator is negative feedback-connected to the input terminal of the operational amplifier of the non-ideal integrator through the negative feedback resistor.

4. The filter circuit as set forth in claim 3, wherein the capacitance of the capacitor of the non-ideal integrator is equal to or less than half of the capacitance of the second capacitor of the second ideal integrator, and the capacitance of the first capacitor of the first ideal integrator of is equal or less than the capacitance of the third capacitor of the third ideal integrator.

5. The filter circuit as set forth in claim 3, wherein the capacitance of the second capacitor of the second ideal integrator is equal to or less than half of the capacitance of the capacitor of the non-ideal integrator, and the capacitance of the third capacitor included of the third ideal integrator is equal to or less than half of the capacitance of the first capacitor of the first ideal integrator.

6. The filter circuit as set forth in any of claim 2, wherein:
   the operational amplifier of the non-ideal integrator and the first operational amplifier of the first ideal integrator are each comprised of a differential output operational amplifier including inverting input and output terminals and non-inverting input and output terminals;
   the negative feedback resistor is a first negative feedback resistor, wherein the filter circuit further includes a second negative feedback resistor, the first and second negative feedback resistors being connected in parallel between the signal output unit and the signal input unit;
   the inverting output terminal and the non-inverting output terminal of the operational amplifier of the non-ideal integrator are respectively connected to the inverting input terminal and the non-inverting input terminal of the first operational amplifier of the first ideal integrator;
   the inverting output terminal and the non-inverting output terminal of the first operational amplifier of the first ideal integrator are respectively connected to the non-inverting input terminal and the inverting input terminal of the operational amplifier of the non-ideal integrator through the first negative feedback resistor and the second negative feedback resistor, respectively.

7. A wireless receiver for generating received data, comprising:
   a mixer configured to generate first and second frequency signals by respectively mixing first and second local oscillator signals, which have a phase difference of 90° therebetween, with high-frequency signals that are obtained from received wireless signals having frequencies different than each other;
   a first bandpass filter configured to extract, from the first frequency signal, a first intermediate frequency signal corresponding to a first frequency band;
   a second bandpass filter configured to extract, from the second frequency signal, a second intermediate frequency signal corresponding to the first frequency band, the first and second bandpass filters each including
      a first filter unit having a signal input unit, a signal output unit, a non-ideal integrator and a first ideal integrator, the non-ideal integrator and the first ideal integrator being connected in series between the signal input unit and the signal output unit,
      a second filter unit including a second ideal integrator that is negative feedback-connected to the non-ideal integrator or the first ideal integrator, and
      a negative feedback resistor connected between the signal output unit and the signal input unit of the first filter unit;
   a first analog-digital converter configured to convert the first intermediate frequency signal into a digital signal to generate a first digital intermediate frequency signal;

a second analog-digital converter configured to convert the second intermediate frequency signal into a digital signal to generate a second digital intermediate frequency signal;

a digital processor configured to perform an attenuating process on the first and second digital intermediate frequency signals so as to attenuate image response included in the first and second digital intermediate frequency signals, and extract digital data signals corresponding to a second frequency band from the first and second digital intermediate frequency signals; and a demodulator configured to demodulate the digital data signals to generate the received data.

8. The wireless receiver set forth in claim 7, wherein a lower limit of the first frequency band is equal to or lower than half of a lower limit of the second frequency band.

9. The wireless receiver as set forth in any one of claim 7, wherein the non-ideal integrator includes an operational amplifier;

the first ideal integrator includes a first operational amplifier;

the ideal integrator of the second filter unit is a second ideal integrator that is negative feedback-connected between an output terminal and an input terminal of the operational amplifier of the non-ideal integrator, and the second filter unit further includes a third ideal integrator that is negative feedback-connected between an output terminal and an input terminal of the first operational amplifier of the first ideal integrator.

10. The wireless receiver as set forth in claim 9, wherein:

the non-ideal integrator includes a resistor and a capacitor that are connected in parallel between the output terminal and the input terminal of the operational amplifier of the non-ideal integrator;

the second and third ideal integrators include a second operational amplifier and a third operational amplifier, respectively;

the first, the second, and the third ideal integrator respectively include a first, a second, and a third capacitor that are connected between an output terminal and an input terminal of the first, the second, and the third operational amplifier, respectively;

the output terminal of the operational amplifier of the non-ideal integrator is connected to the input terminal of the first operational amplifier of the first ideal integrator; and the output terminal of the first operational amplifier of the first ideal integrator is negative feedback-connected to the input terminal of the operational amplifier of the non-ideal integrator through the negative feedback resistor.

11. The wireless receiver as set forth in claim 9, wherein:

the operational amplifier of the non-ideal integrator and the first operational amplifier of the first ideal integrator are each comprised of a differential output operational amplifier including inverting input and output terminals and non-inverting input and output terminals;

the negative feedback resistor is a first negative feedback resistor, wherein each of the first and second bypass filters further includes a second negative feedback resistor, the first and second negative feedback resistors being connected in parallel between the signal output unit and the signal input unit;

the inverting output terminal and the non-inverting output terminal of the operational amplifier of the non-ideal integrator are respectively connected to the inverting input terminal and the non-inverting input terminal of the first operational amplifier of the first ideal integrator; and the inverting output terminal and the non-inverting output terminal of the first operational amplifier of the first ideal integrator are respectively connected to the non-inverting input terminal and the inverting input terminal of the operational amplifier of the non-ideal integrator through the first negative feedback resistor and the second negative feedback resistor, respectively.

12. A wireless receiver for generating received data, comprising:

a filter circuit configured to extract an intermediate frequency signal corresponding to a first frequency band from a high-frequency signal obtained from a received wireless signal, the filter circuit including a first filter unit having a signal input unit, a signal output unit, a non-ideal integrator and a first ideal integrator, the non-ideal integrator and the first ideal integrator being connected in series between the signal input unit and the signal output unit, a second filter unit including a second ideal integrator that is negative feedback-connected to the non-ideal integrator or the first ideal integrator, and a negative feedback resistor connected between the signal output unit and the signal input unit of the first filter unit;

an analog-digital convertor configured to convert the intermediate frequency signal into a digital signal to generate a digital intermediate frequency signal;

a digital processor configured to extract, from the digital intermediate frequency signal, a digital data signal corresponding to a second frequency band; and a demodulator configured to demodulate the digital data signal to generate the received data.

13. The wireless receiver set forth in claim 12 wherein a lower limit of the first frequency band is equal to or lower than half of a lower limit of the second frequency band.

14. The wireless receiver as set forth in claim 12, wherein the non-ideal integrator includes an operational amplifier;

the first ideal integrator includes a first operational amplifier;

the ideal integrator of the second filter unit is a second ideal integrator that is negative feedback-connected between an output terminal and an input terminal of the operational amplifier of the non-ideal integrator, and the second filter unit further includes a third ideal integrator that is negative feedback-connected between an output terminal and an input terminal of the first operational amplifier of the first ideal integrator.

15. The wireless receiver as set forth in claim 14, wherein:

the non-ideal integrator includes a resistor and a capacitor that are connected in parallel between the output terminal and the input terminal of the operational amplifier of the non-ideal integrator;

the second and third ideal integrators include a second operational amplifier and a third operational amplifier, respectively;

the first, the second, and the third ideal integrator include respectively a first, a second, and a third capacitor connected between an output terminal and an input terminal of the first, the second, and the third operational amplifier, respectively;

the output terminal of the operational amplifier of the non-ideal integrator is connected to the input terminal of the first operational amplifier of the first ideal integrator; and the output terminal of the first operational amplifier of the first ideal integrator is negative feedback-connected to the input terminal of the operational amplifier of the non-ideal integrator through the negative feedback resistor.

16. The wireless receiver as set forth in claim 14, wherein:

the operational amplifier of the non-ideal integrator and the first operational amplifier of the first ideal integrator are each comprised of a differential output operational amplifier including inverting input and output terminals and non-inverting input and output terminals;

the negative feedback resistor is a first negative feedback resistor, wherein the filter circuit further includes a second negative feedback resistor, the first and second negative feedback resistors being connected in parallel between the signal output unit and the signal input unit;

the inverting output terminal and the non-inverting output terminal of the operational amplifier of the non-ideal integrator are respectively connected to the inverting input terminal and the non-inverting input terminal of the first operational amplifier of the first ideal integrator; and the inverting output terminal and the non-inverting output terminal of the first operational amplifier of the first ideal integrator are respectively connected to the non-inverting input terminal and the inverting input terminal of the operational amplifier of the non-ideal integrator through the first negative feedback resistor and the second negative feedback resistor, respectively.

* * * * *